(12) United States Patent
Hosokawa et al.

(10) Patent No.: US 9,222,165 B2
(45) Date of Patent: Dec. 29, 2015

(54) COOLED PVD SHIELD

(75) Inventors: Akihiro Hosokawa, Cupertino, CA (US); Bradley O. Stimson, Monte Sereno, CA (US); Hienminh Huu Le, San Jose, CA (US); Makoto Inagawa, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 871 days.

(21) Appl. No.: 13/353,136

(22) Filed: Jan. 18, 2012

(65) Prior Publication Data

US 2012/0111273 A1 May 10, 2012

Related U.S. Application Data

(63) Continuation of application No. 11/764,217, filed on Jun. 17, 2007.

(60) Provisional application No. 60/805,858, filed on Jun. 26, 2006.

(51) Int. Cl.
*C23C 14/34* (2006.01)
*C23C 14/04* (2006.01)
*H01J 37/32* (2006.01)
*C23C 14/50* (2006.01)
*C23C 14/56* (2006.01)

(52) U.S. Cl.
CPC .............. *C23C 14/042* (2013.01); *C23C 14/50* (2013.01); *C23C 14/564* (2013.01); *H01J 37/32458* (2013.01); *H01J 37/32623* (2013.01); *H01J 37/32651* (2013.01); *H01J 37/32715* (2013.01)

(58) Field of Classification Search
CPC C23C 14/50; H01J 37/32458; H01J 37/3447; H01J 37/3411
See application file for complete search history.

(56) References Cited

U.S. PATENT DOCUMENTS

| | | | |
|---|---|---|---|
| 4,604,180 A | | 8/1986 | Hirukawa et al. |
| 5,135,634 A | | 8/1992 | Clarke |
| 5,223,111 A | * | 6/1993 | Lueft ..................... 204/298.07 |
| 5,352,294 A | | 10/1994 | White et al. |
| 5,458,759 A | | 10/1995 | Hosokawa et al. |
| 5,518,593 A | * | 5/1996 | Hosokawa et al. ...... 204/192.12 |
| 5,690,795 A | * | 11/1997 | Rosenstein et al. ........ 204/192.1 |
| 6,221,221 B1 | | 4/2001 | Al-Shaikh et al. |

(Continued)

FOREIGN PATENT DOCUMENTS

| | | |
|---|---|---|
| KR | 2004-108790 | 12/2004 |
| KR | 102004010879 | 12/2004 |
| WO | WO-03-097894 A2 | 11/2003 |

OTHER PUBLICATIONS

Notice of Foreign Allowance dated Nov. 28, 2008 for Utility Model Application No. 20-2007-0010032.

(Continued)

*Primary Examiner* — Jason M Berman
(74) *Attorney, Agent, or Firm* — Patterson & Sheridan, LLP

(57) ABSTRACT

The present invention generally comprises a top shield for shielding a shadow frame within a PVD chamber. The top shield may remain in a stationary position and at least partially shield the shadow frame to reduce the amount of material that may deposit on the shadow frame during processing. The top shield may be cooled to reduce the amount of fluxuation in temperature of the top shield and shadow frame during processing and/or during down time.

20 Claims, 4 Drawing Sheets

(56) References Cited

U.S. PATENT DOCUMENTS

| | | | |
|---|---|---|---|
| 6,228,229 B1 | 5/2001 | Raaijmakers et al. | |
| 6,235,169 B1 | 5/2001 | Gopalraja et al. | |
| 6,254,738 B1 | 7/2001 | Stimson et al. | |
| 6,254,746 B1 | 7/2001 | Subramani et al. | |
| 6,264,812 B1 | 7/2001 | Raaijmakers et al. | |
| 6,267,851 B1 | 7/2001 | Hosokawa | |
| 6,345,588 B1 | 2/2002 | Stimson | |
| 6,723,214 B2 | 4/2004 | Stimson et al. | |
| 6,773,562 B1 | 8/2004 | Inagawa et al. | |
| 6,824,658 B2 | 11/2004 | Gopalraja et al. | |
| 6,884,319 B2 * | 4/2005 | Kim | 156/345.52 |
| 7,163,607 B2 | 1/2007 | Stimson et al. | |
| 2001/0019016 A1 | 9/2001 | Subramani et al. | |
| 2002/0046945 A1 | 4/2002 | Hosokawa et al. | |
| 2002/0053513 A1 | 5/2002 | Stimson et al. | |
| 2003/0029715 A1* | 2/2003 | Yu et al. | 204/192.2 |
| 2003/0051994 A1 | 3/2003 | Gopalraja et al. | |
| 2006/0266638 A1 | 11/2006 | Hosokawa et al. | |
| 2006/0266639 A1 | 11/2006 | Le et al. | |
| 2007/0012557 A1 | 1/2007 | Hosokawa et al. | |
| 2007/0012558 A1 | 1/2007 | White et al. | |
| 2007/0012562 A1 | 1/2007 | Le et al. | |
| 2007/0017798 A1 | 1/2007 | Inagawa | |
| 2007/0023275 A1 | 2/2007 | Tanase et al. | |
| 2007/0056850 A1 | 3/2007 | Ye et al. | |
| 2007/0084720 A1 | 4/2007 | Hosokawa et al. | |
| 2007/0151841 A1 | 7/2007 | Inagawa et al. | |

OTHER PUBLICATIONS

Notification of Granting Utility Model Patent Right and Going through the Formalities of Registration, Dec. 12, 2008.

Korean Notice of Foreign Allowance dated Nov. 28, 2008 for Korean Application No. 20-2007-0010032.

Korean Office Action for Application No. 20-2007-0010032 dated Jun. 23, 2008.

Second Notification to Make Rectification dated Jul. 18, 2008 for Chinese Application No. 2007201503499.

* cited by examiner

COOLED PVD SHIELD

CROSS-REFERENCE TO RELATED APPLICATIONS

This application is a continuation of U.S. patent application Ser. No. 11/764,217 (APPM/11276), filed Jun. 17, 2007, which application claims benefit of U.S. Provisional Patent Application Ser. No. 60/805,858, filed Jun. 26, 2006, both of which are herein incorporated by reference.

BACKGROUND OF THE INVENTION

1. Field of the Invention

Embodiments of the present invention generally relate to a cooled shield used in a physical vapor deposition (PVD) system.

2. Description of the Related Art

PVD using a magnetron is one method of depositing material onto a substrate. During a PVD process a target may be electrically biased so that ions generated in a process region can bombard the target surface with sufficient energy to dislodge atoms from the target. The process of biasing a target to cause the generation of a plasma that causes ions to bombard and remove atoms from the target surface is commonly called sputtering. The sputtered atoms travel generally toward the substrate being sputter coated, and the sputtered atoms are deposited on the substrate. Alternatively, the atoms react with a gas in the plasma, for example, nitrogen, to reactively deposit a compound on the substrate. Reactive sputtering is often used to form thin barrier and nucleation layers of titanium nitride or tantalum nitride on the substrate.

Direct current (DC) sputtering and alternating current (AC) sputtering are forms of sputtering in which the target is biased to attract ions towards the target. The target may be biased to a negative bias in the range of about −100 to −600 V to attract positive ions of the working gas (e.g., argon) toward the target to sputter the atoms. Usually, the sides of the sputter chamber are covered with a shield to protect the chamber walls from sputter deposition. The shield may be electrically grounded and thus provide an anode in opposition to the target cathode to capacitively couple the target power to the plasma generated in the sputter chamber.

During sputtering, material may sputter and deposit on the exposed surfaces within the chamber. As chamber components are moved, material that has been deposited thereon may flake off and contaminate the substrate. As temperatures fluxuate from a processing temperature to a lower, non-processing temperature, material may additionally flake off of a moving component.

When depositing thin films over substrates such as wafer substrates, glass substrates, flat panel display substrates, solar panel substrates, and other suitable substrates, flaking may contaminate the substrate. Therefore, there is a need in the art to reduce flaking in PVD chambers.

SUMMARY OF THE INVENTION

The present invention generally comprises a top shield for shielding a shadow frame within a PVD chamber. The top shield may remain in a stationary position and at least partially shield the shadow frame to reduce the amount of material that may deposit on the shadow frame during processing. The top shield may be cooled to reduce the amount of fluxuation in temperature of the top shield and shadow frame during processing and/or during down time.

In one embodiment, a physical vapor deposition apparatus is disclosed. The apparatus comprises a shadow frame movable between a lowered position and a raised position, a top shield which at least partially overlies the shadow frame, and a cooling manifold coupled with the top shield, wherein the cooling manifold controls the temperature of the top shield.

In another embodiment, a physical vapor deposition apparatus is disclosed. The apparatus comprises a chamber, a susceptor disposed in the chamber and movable between a raised position and a lowered position, a shadow frame positioned to shield a periphery of the susceptor when the susceptor is in the raised position, the shadow frame movable between a raised position and a lowered position, and a top shield positioned to shield at least a portion of the shadow frame, wherein the top shield is cooled.

In another embodiment, a method of processing a substrate is disclosed. The method comprises positioning a target over a susceptor within a processing chamber, wherein the processing chamber comprises a shadow frame that shields an edge of the susceptor from deposition and a top shield that shields the shadow frame from deposition and sputtering material from the target onto the substrate to deposit a layer on the substrate.

In another embodiment, a physical vapor deposition method is disclosed. The method comprises positioning a substrate on a susceptor within a chamber, the susceptor movable between a raised position and a lowered position, the chamber comprising shadow frame movable between a raised position and a lowered position and a top shield, wherein the top shield at least partially shields the shadow frame, raising the susceptor and shadow frame to a processing position, and depositing material on the substrate, wherein the top shield reduces the amount of deposition on the shadow frame.

In another embodiment, a shield kit is disclosed. The kit comprises a manifold shelf, a cooling manifold coupled with the manifold shelf, wherein cooling channels are coupled within the cooling manifold, a top shield coupled with the cooling manifold, wherein the top shield has an interior width that is less than the interior width of the cooling manifold, and an under shield coupled with the cooling manifold, wherein the under shield has an interior width that is greater than the interior width of the top shield, but less than the interior width of the cooling manifold.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally comprises a top shield for shielding a shadow frame within a PVD chamber. The top shield may remain in a stationary position and at least partially shield the shadow frame to reduce the amount of material that may deposit on the shadow frame during processing. The top shield may be cooled to reduce the amount of fluxuation in temperature of the top shield and shadow frame during processing and/or during down time.

The invention is illustratively described and may be used in a physical vapor deposition system for processing large area substrates, such as a PVD system, available from AKT®, a subsidiary of Applied Materials, Inc., Santa Clara, Calif. or a PVD chamber available from Applied Materials Gmbh & Co. KG, located at Alzenau, Germany. However, it should be understood that the sputtering target may have utility in other system configurations, including those systems configured to process large area round substrates. An exemplary system in which the present invention can be practiced is described in U.S. patent application Ser. No. 11/225,922, filed Sep. 13, 2005 and now published as U.S. Patent Publication No. 2007/0056850, which is hereby incorporated by reference in its entirety.

Figure 1:
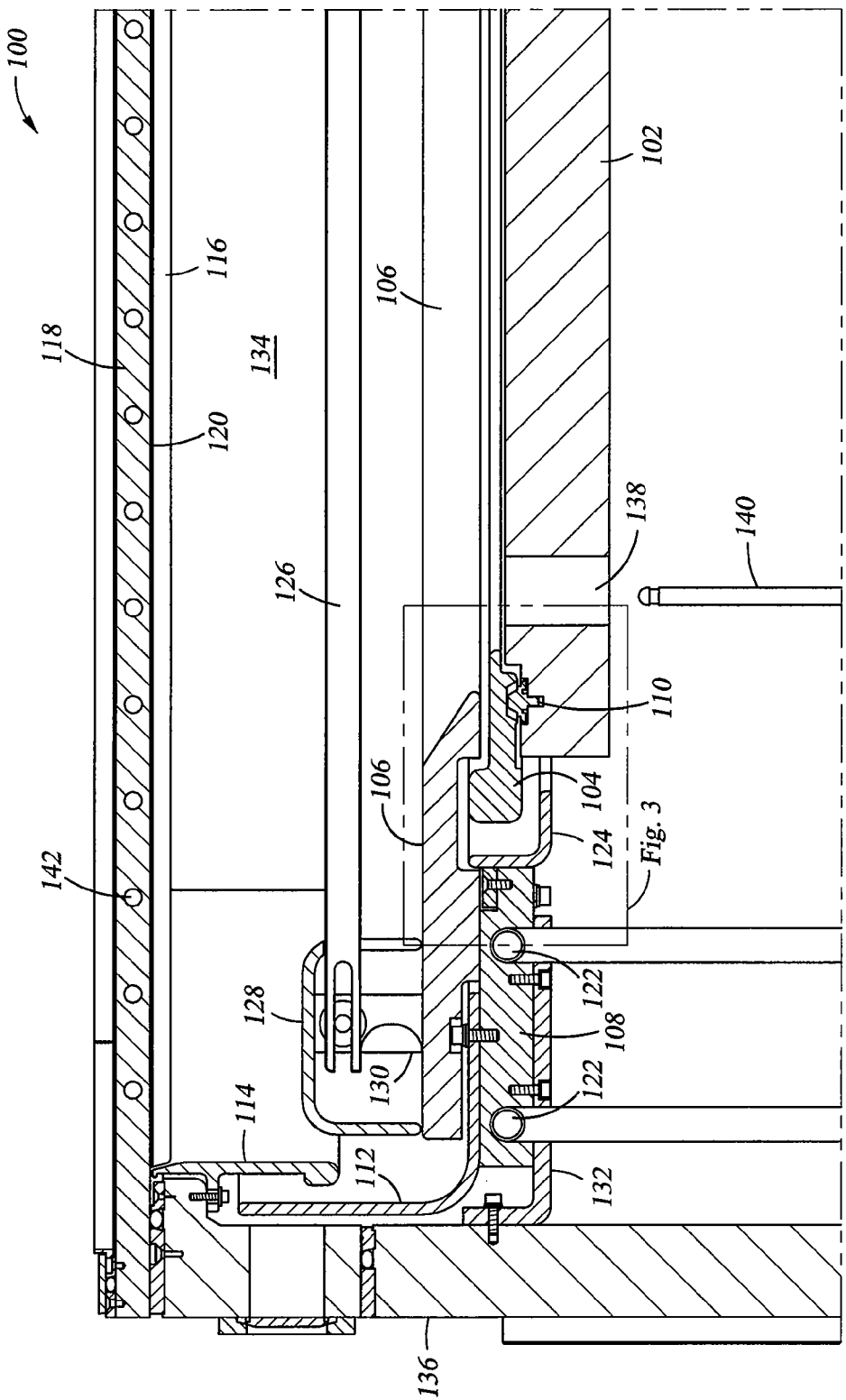
FIG. 1 is a schematic view of an apparatus with the susceptor in a raised position according to one embodiment of the invention.

FIG. 1 is a schematic view of a PVD apparatus 100 according to one embodiment of the invention. The apparatus 100 comprises a target 116 bonded to a backing plate 118 by a bonding material 120. The target 116 lies in opposition to a susceptor 102 within the chamber 134. Cooling channels 142 may be present in the backing plate 118 to provide a uniform temperature across the target 116. A dark space shield 114 surrounds the target 116. A magnetron (not shown) may be present behind the backing plate.

To help provide uniform sputtering deposition across a substrate, an anode 126 may be placed between the target 116 and the substrate (not shown). The anode 126 is mounted with an anchor mount 130, which is shielded from deposition by an anode shield 128. The anode 126 provides a charge in opposition to the target 116 so that charged ions will be attracted thereto rather than to the chamber walls 136 which are typically at ground potential. By providing the anode between the target 116 and the substrate, the plasma will be more uniform, which will aid in the deposition.

During sputtering, material may deposit on exposed areas of the chamber 134 including the walls 136. To reduce deposition on the chamber walls 136, a chamber shield 112 may be placed in the chamber 134 to shield the walls 136 from deposition material. The chamber shield 112 may be removed for cleaning or replaced as necessary. The chamber shield 112 may reduce chamber downtime because removing or replacing the chamber shield 112 may occur faster than cleaning the chamber walls 136.

Figure 2:
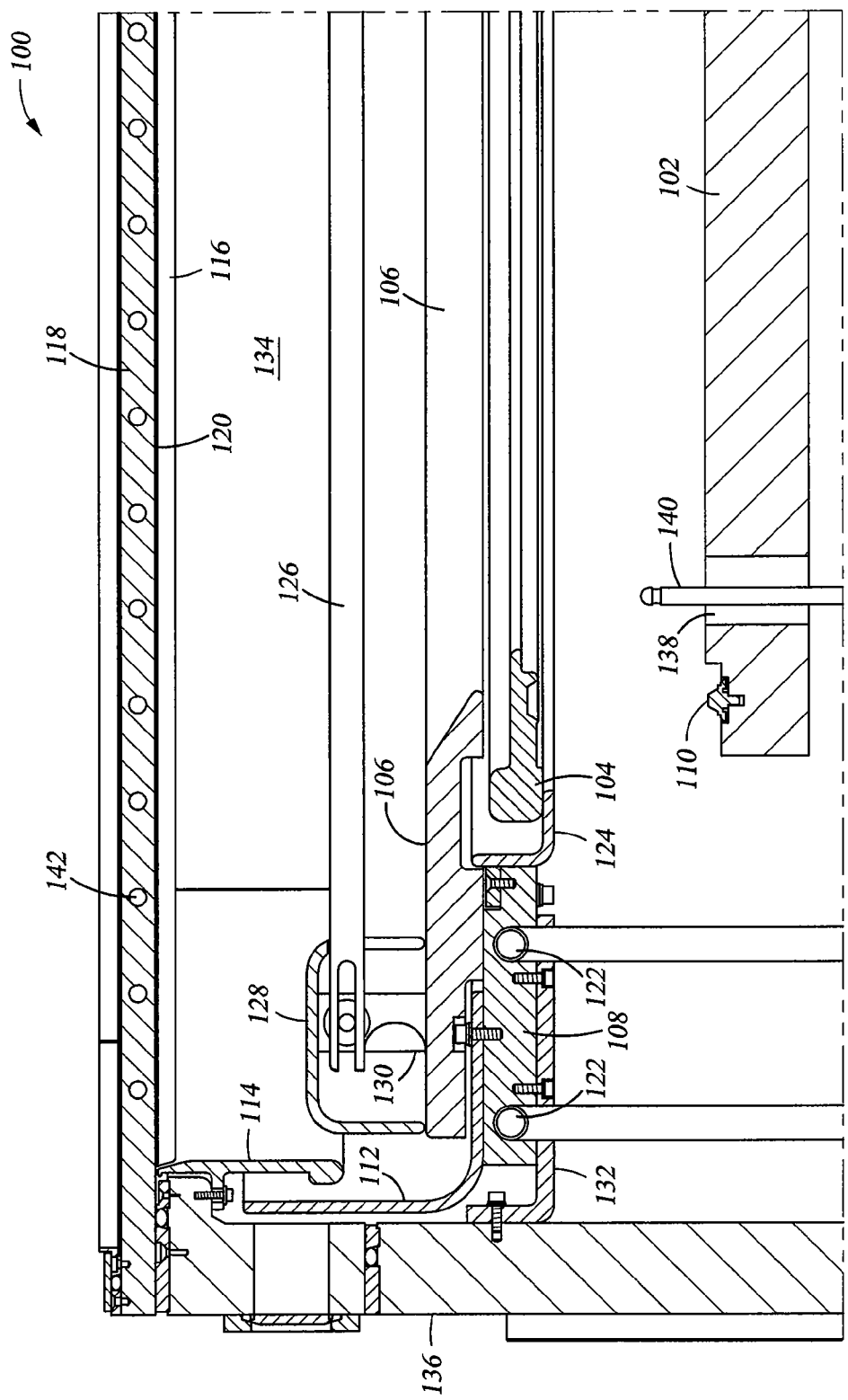
FIG. 2 is a schematic view of the apparatus of FIG. 1 with the susceptor in the lowered position.

Material may also deposit on areas of the susceptor 102 which are not covered by the substrate. To reduce deposition on the susceptor 102, a shadow frame 104 may be positioned to cover the exposed areas of the susceptor 102. The shadow frame 104 is not attached to the susceptor 102. The shadow frame 104 will rest on a under shield 124 when the susceptor 102 is in a lowered position (see FIG. 2).

Figure 3:
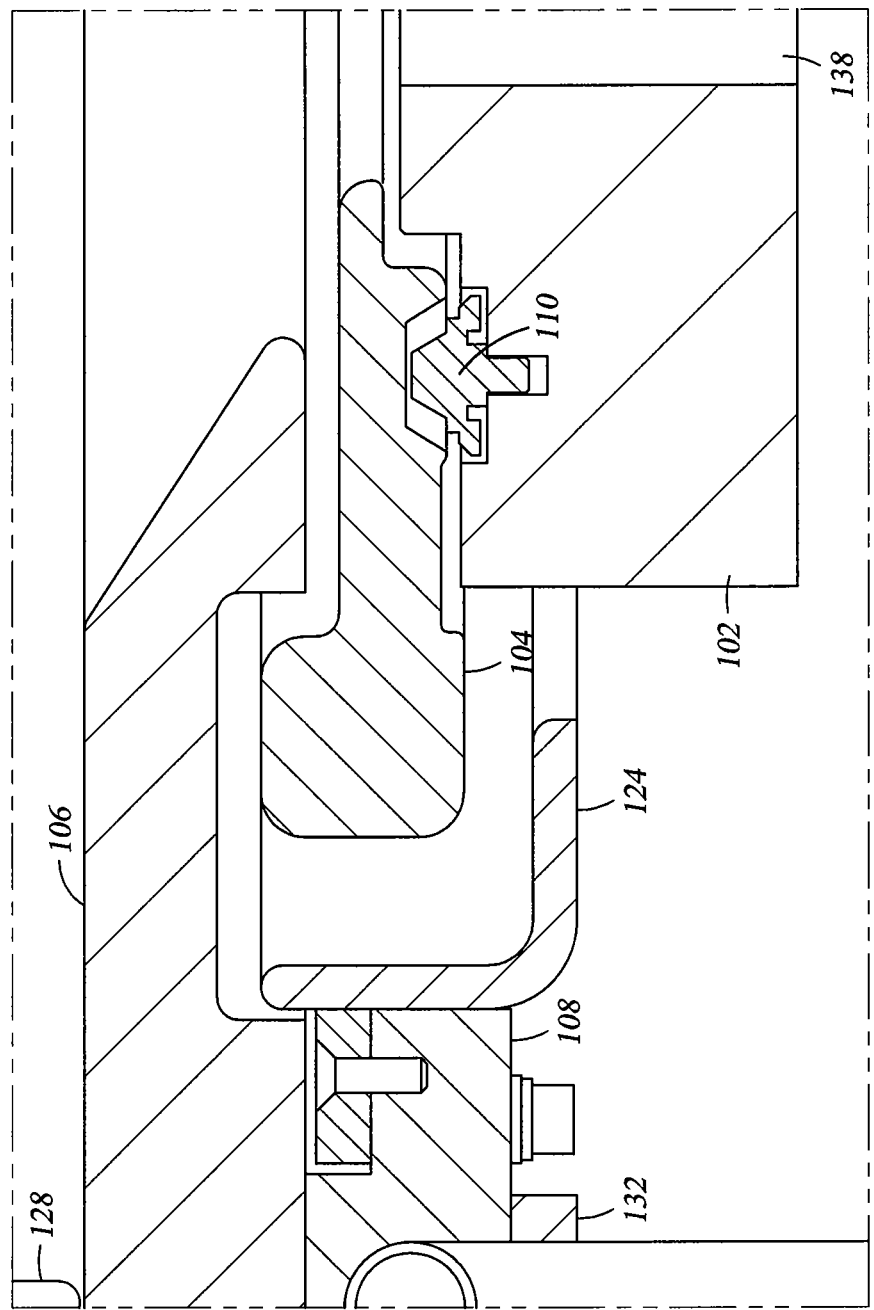
FIG. 3 is a close up view of the top shield of FIG. 1 with the susceptor in the raised position.

When a substrate enters the chamber 134, the susceptor 102 is in a lowered position. The substrate is inserted into the chamber 134 and placed on lift pins 140 which pass through holes 138 that are within the susceptor 102. The susceptor 102 raises to meet the substrate, and the lift pins 140 lower. Once the substrate is on the susceptor 102, the susceptor 102 continues to rise to the processing position. On the way to the processing position, the susceptor 102 encounters the shadow frame 104, which rests on the under shield 124. The shadow frame 104 is then raised from its lowered position to the processing position by shadow frame lift pins 110, which are positioned on the susceptor 102. When the susceptor 102 is in the processing position, so is the shadow frame 104 (see FIG. 3). The shadow frame 104 will reduce the amount of deposition that may occur on the susceptor 102 and permit a non-deposited area on the substrate to form per process requirements.

As the shadow frame 104 is moved between a lowered position and a raised position, material that is deposited on the shadow frame 104 may flake off. The material that flakes off may contaminate a substrate. The temperature variations that may occur during and after processing may also contribute to the flaking. The temperature variations occur because during processing, the shadow frame 104 will be elevated due to the plasma, but the temperature will be lower when the processing is completed and the plasma is no longer present. The heating and cooling may cause the shadow frame 104 to expand and contract. The expanding and contracting, along with the shadow frame 104 movements, may cause the shadow frame 104 to flake.

To reduce flaking from the shadow frame 104, a top shield 106 may be used. The top shield 106 reduces the amount of deposition that may occur on the shadow frame 104 by at least partially shielding the shadow frame 104. The top shield 106 is stationary within the chamber 134. The temperature of the top shield 106 may be controlled by a cooling manifold 108. The cooling manifold 108 controls the temperature of the top shield 106 to reduce any expansion and contraction that may occur during and after processing. By controlling the temperature of the top shield 106 and hence, the expansion and contraction of the top shield 106, flaking of the top shield 106 may be reduced. Additionally, cooling the top shield 106 may control the temperature of the shadow frame 104 as well due to the proximity of the shadow frame 104 to the top shield 106.

Cooling channels 122 present within the cooling manifold 108 deliver a cooling fluid to the cooling manifold 108. The cooling channels 122 circulate the cooling fluid through the cooling manifold 108. The cooling fluid may be any conventionally known cooling fluid.

The cooling manifold 108 is supported by a manifold shelf 132 within the chamber 134. The manifold shelf 132 is coupled to the chamber 134 by any conventional attachment means known to one of ordinary skill in the art. In one embodiment, the cooling manifold 108 is coupled with the manifold shelf 132, and the under shield 124, chamber shield 112, and top shield 106 are all coupled with the cooling manifold 108. The under shield 124, chamber shield 112, and top shield 106 may all be coupled to the cooling manifold 108 by any conventional attachment means known to one of ordinary skill in the art. In one embodiment, the attachment means comprises a screw. In another embodiment, the attachment means comprises a nut and bolt arrangement. In yet another embodiment, the cooling manifold 108 and at least one of the manifold shelf 132, under shield 124, top shield 106, and chamber shield 112 are a unitary piece performing each of the functions.

Figure 4:
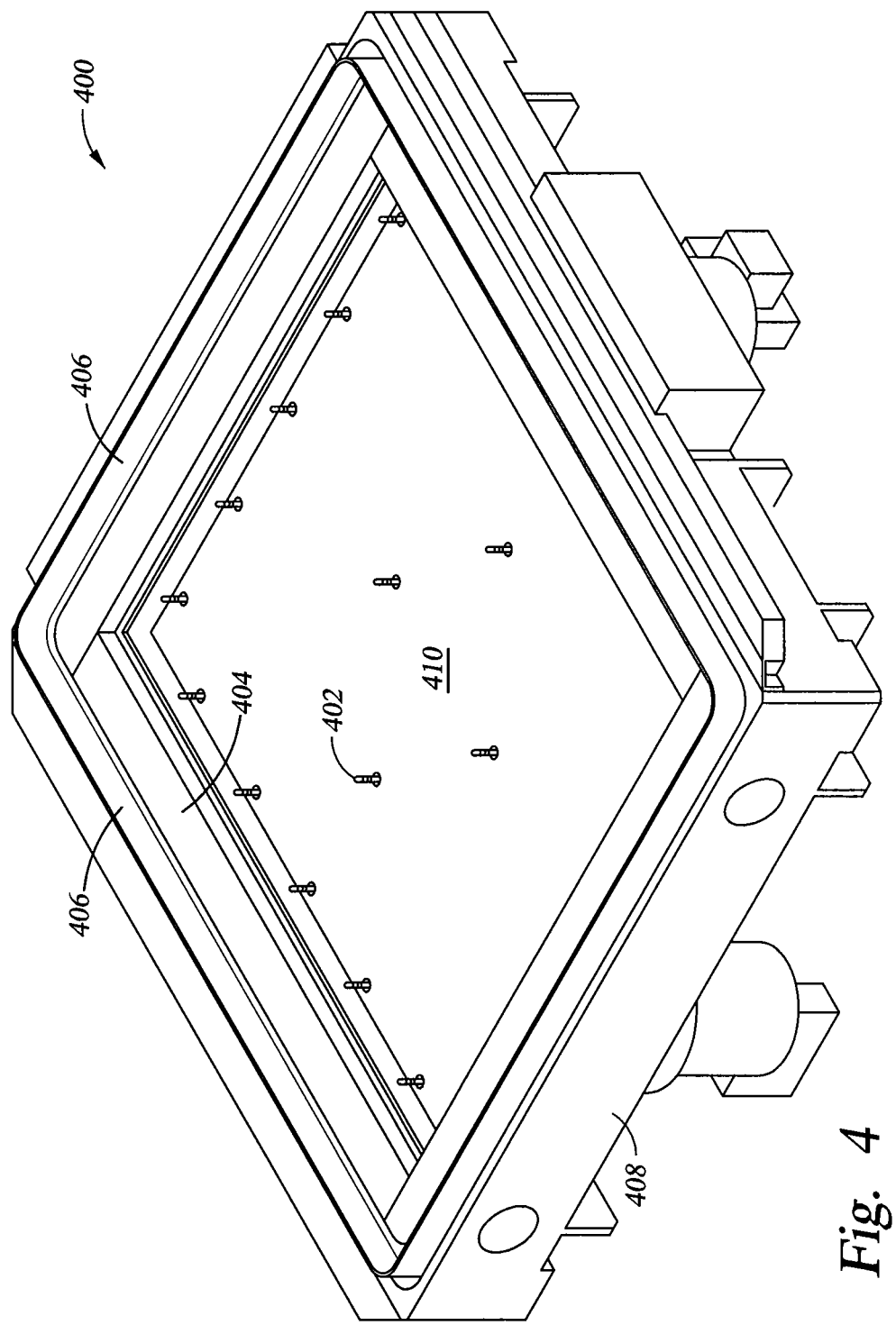
FIG. 4 is a cut away view of the bottom section of a PVD chamber according to one embodiment of the invention.

FIG. 4 is a cut away view of the bottom section of an apparatus 400 according to one embodiment of the invention. The apparatus 400 has the target and backing plate removed. The apparatus comprises chamber walls 408 that surround a processing region. Within the apparatus 400 are a susceptor 410 through which lift pins 402 may rise to meet an incoming substrate. The inside chamber walls 408 may be lined with a chamber shield 406. A top shield 404 reduces deposition on a shadow frame. The shadow frame (not shown) protects the edges of the susceptor 410 from deposition. In the embodiment shown in FIG. 4, the top shield 404 shields the shadow frame from deposition.

While the foregoing is directed to embodiments of the present invention, other and further embodiments of the invention may be devised without departing from the basic scope thereof, and the scope thereof is determined by the claims that follow.

The invention claimed is:

1. A physical vapor deposition apparatus, comprising:
a chamber;
a shadow frame disposed within the chamber;
a top shield disposed within the chamber and which at least partially overlies the shadow frame;
a cooling manifold disposed within the chamber and coupled with the top shield, wherein the cooling manifold controls the temperature of the top shield;
a manifold shelf coupled to the cooling manifold and the chamber;
a chamber shield coupled to the chamber and to the cooling manifold in a location between the cooling manifold and the top shield; and
an under shield coupled to the cooling manifold, wherein the shadow frame is movable from a lowered position in contact with the under shield to a processing position spaced from the under shield.

2. The apparatus of claim 1, wherein the top shield reduces material deposition on the shadow frame.

3. The apparatus of claim 1, wherein the top shield and the manifold are a unitary piece.

4. The apparatus of claim 1, wherein the cooling manifold is water cooled.

5. The apparatus of claim 1, further comprising:
cooling channels coupled between the manifold shelf and the cooling manifold.

6. The apparatus of claim 1, further comprising:
cooling channels within the cooling manifold.

7. The apparatus of claim 1, wherein the top shield comprises aluminum or stainless steel.

8. A physical vapor deposition apparatus, comprising:
a chamber;
a susceptor disposed in the chamber and movable between a raised position and a lowered position;
a shadow frame disposed within the chamber and positioned to shield a periphery of the susceptor when the susceptor is in the raised position, the shadow frame movable between a raised position and a lowered position;
a top shield disposed within the chamber and positioned to shield at least a portion of the shadow frame;
a cooling manifold disposed within the chamber and coupled with the top shield;
a chamber shield coupled to the chamber and to the cooling manifold in a location between the cooling manifold and the top shield; and
an under shield coupled to the cooling manifold, wherein the shadow frame is movable from the lowered position in contact with the under shield to the raised position spaced from the under shield.

9. The apparatus of claim 8, wherein the cooling manifold and at least one of the top shield, the under shield, and the manifold shelf are a unitary piece.

10. The apparatus of claim 9, wherein the top shield comprises aluminum or stainless steel.

11. The apparatus of claim 8, wherein the top shield comprises aluminum or stainless steel.

12. A physical vapor deposition apparatus, comprising:
a chamber body;
a manifold shelf coupled to the chamber body;
a cooling manifold having a first surface coupled to the manifold shelf, the cooling manifold having a cooling channel disposed therein;
an under shield coupled to the cooling manifold on a second surface perpendicular to the first surface;
a chamber shield coupled to the cooling manifold on a third surface opposite the first surface, the chamber shield also coupled to the chamber body;
a top shield coupled with both the cooling manifold and the chamber shield; and
a shadow frame movable from a first position in contact with the under shield and a second position spaced from the under shield.

13. The apparatus of claim 12, wherein the cooling manifold has two cooling channels disposed thereon.

14. The apparatus of claim 13, further comprising a lift pin.

15. The apparatus of claim 14, further comprising a susceptor having a hole therethrough to permit the lift pin to extend therethrough.

16. The apparatus of claim 15, further comprising a target bonded to a backing plate that is disposed opposite the susceptor.

17. The apparatus of claim 16, wherein the backing plate has cooling channels therein.

18. The apparatus of claim 17, wherein the top shield comprises aluminum or stainless steel.

19. The apparatus of claim 16, wherein the top shield comprises aluminum or stainless steel.

20. The apparatus of claim 12, wherein the top shield comprises aluminum or stainless steel.

* * * * *